Dec. 27, 1960 G. C. SZIKLAI 2,966,632

MULTISTAGE SEMI-CONDUCTOR SIGNAL TRANSLATING CIRCUITS

Filed Nov. 15, 1952

INVENTOR
GEORGE C. SZIKLAI
BY Charles H. Brown
ATTORNEY

United States Patent Office 2,966,632

Patented Dec. 27, 1960

2,966,632

MULTISTAGE SEMI-CONDUCTOR SIGNAL TRANSLATING CIRCUITS

George C. Sziklai, Princeton, N.J., assignor to Radio Corporation of America, a corporation of Delaware Filed Nov. 15, 1952, Ser. No. 320,713

6 Claims. (Cl. 330—13)

This invention relates generally to semi-conductor signal translating circuits, and particularly to direct coupled multistage semi-conductor signal translating circuits.

Amplification of the direct current component of a signal, as well as the low-frequency and higher-frequency components of the signal, is often desired in the electronic arts. There has been some difficulty in achieving this objective with electron discharge devices because of the static direct current voltage requirements of electron discharge devices and the fact that they are voltage-operated devices, that is, the output voltage is primarily a function of input voltage.

According to the teachings of this invention, semi-conductor devices are directly connected in cascade to provide an amplifier which amplifies the direct current component of an input signal, as well as the low-frequency and higher-frequency components. The output of one semi-conductor device in the amplifier is directly connected to the input of the next following semi-conductor device, without the need for a coupling capacitor such as is employed in amplifiers including electron discharge devices.

Presently available semi-conductor devices for the amplification of a signal are known as transistors. Transistors are generally three-electrode semi-conductor devices which include a block of semi-conductive material such as germanium or silicon. The three main electrodes for a transistor are the emitter, collector and base electrodes. Present transistors are of the two types: the point contact type and the junction type. Point contact transistors have a base electrode in large-area, low-resistance contact with a block of semi-conductive material and have emitter and collector electrodes in the form of wires in rectifying contact with the block of semi-conductive material. The semi-conductive material may be of the n-type having an excess of electrons or may be of the p-type having an excess of "holes." Junction transistors have a body with one type of material in the center and the other type on both sides. The junction transistor may be of the p-n-p type or the n-p-n type. The base electrode is connected to the central material and the emitter and collector electrodes are connected to the end materials, respectively.

As is known in the art, n-type point contact transistors have much in common with p-n-p junction transistors, and p-type point contact transistors have much in common with n-p-n junction transistors. So far as I am aware, there are no commonly accepted terms which are generic to the corresponding types of point contact and junction transistors. The term "n-type" transistor or semi-conductor device as used herein is intended to be a term generic to n-type point contact transistors and p-n-p junction transistors, and the term "p-type" transistor or semi-conductor device is intended to be a term generic to p-type point contact transistors and n-p-n junction transistors.

N-type transistors are normally employed in a manner such that the direction of current flow (as contrasted with electron flow) in the emitter electrode is into the body of the semi-conductive material (in the positive direction), and in the base and collector electrodes the direction of current flow is out of the body of the semi-conductive material (in the negative direction). A small current flowing from the emitter electrode through the body of the semi-conductive material and out the base electrode results in the flow of a much larger current from the emitter electrode through the body of the semi-conductive material and out the collector electrode. The direction of current flow in p-type transistors is the opposite of that given above for n-type transistors. Therefore, n-type transistors and p-type transistors may be said to be oppositely conductive, or to possess complementary symmetry.

The opposite and complementary properties of n-type and p-type transistors are utilized in this invention to provide an amplifier capable of amplifying the direct current component of an input signal, as well as to amplify the low-frequency and higher-frequency components. The output of an n-type transistor is directly connected to the input of a p-type transistor, the output of the latter is connected to the input of an n-type transistor, and so on. There may be two oppositely conductive transistors so connected or any reasonable higher number.

It is an object of this invention to provide a multistage transistor circuit wherein the direct current, the low-frequency and the higher-frequency components of an input signal are translated.

It is another object to provide a multistage semi-conductor signal translating circuit wherein n-type and p-type transistors are alternately directly connected in cascade.

It is a further object to provide two direct connected multistage transistor amplifiers, the two amplifiers being connected in push-pull.

It is a further object to provide a direct connected multistage semi-conductor signal translating circuit which is substantially free of the effects of semi-conductor surface leakage currents.

It is a further object to provide a direct connected multistage semi-conductor amplifier having an improved high frequency response.

It is a still further object to provide a multistage semi-conductor signal translating circuit which provides efficient stable operation and includes a minimum number of circuit elements.

A direct connected semi-conductor signal translating circuit in accordance with this invention includes two or more semi-conductor stages with each successive stage of a conductivity type opposite from that of the preceding stage. The output of one semi-conductor stage is directly connected to the input of the following semi-conductor stage.

In one aspect, the invention utilizes p-n-p and n-p-n junction transistors connected in base-input, grounded-emitter circuit stages. The successive stages alternately include a p-n-p junction transistor and an n-p-n junction transistor. The p-n-p transistor emitter electrodes are connected to the positive terminal of a bias source and the n-p-n transistor emitter electrodes are connected to the negative terminal of a bias source. Thus all the emitters are biased in the relatively conducting or forward direction. The collector electrode of each stage is directly connected to the base electrode of the following stage. As a consequence, all of the collector electrodes are biased in the relatively non-conducting or reverse direction.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5:
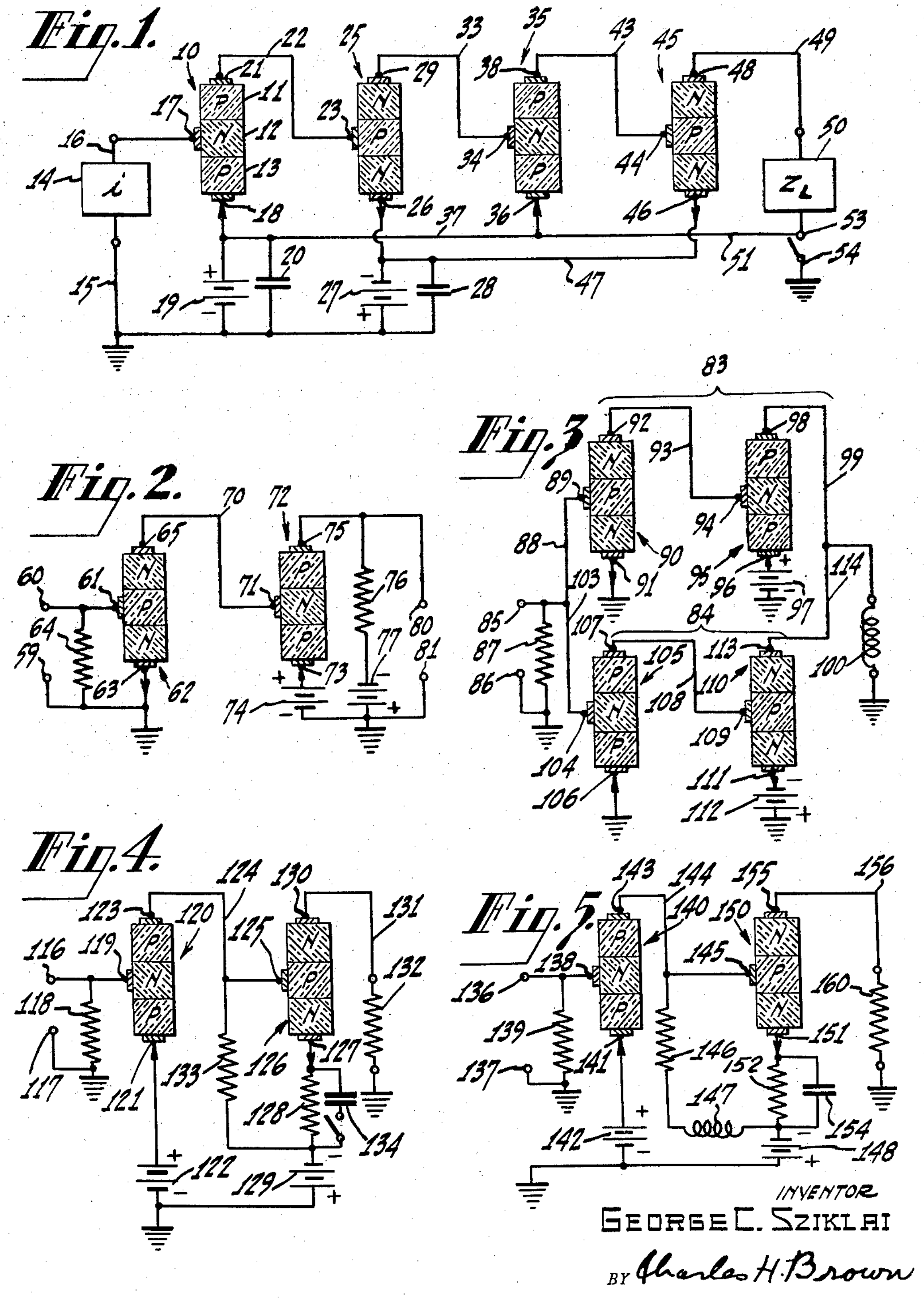
Fig. 1 is a schematic circuit diagram of a four-stage direct coupled semi-conductor signal translating circuit illustrating one embodiment of the present invention.
Fig. 2 is a schematic circuit diagram of a semi-conductor pulse amplifier illustrating another embodiment of the present invention.
Fig. 3 is a schematic circuit diagram of a parallel signal path semi-conductor signal translating circuit wherein the signals in the two paths are 180 degrees out of phase, providing push-pull operation.
Fig. 4 is a schematic circuit diagram of a semi-conductor signal translating circuit illustrating a still further embodiment of the invention, wherein the effects of semi-conductor surface leakage currents are neutralized.
Fig. 5 is a schematic circuit diagram of a two-stage semi-conductor signal translating circuit illustrating a modification of the embodiment shown in Fig. 4, whereby the high frequency response of the circuit is improved.

In the drawing, n-type transistors are represented as p-n-p junction transistors and p-type transistors are represented as n-p-n junction transistors. The transistors are represented as having a body of semi-conductive material with three regions. The three regions are labeled to distinguish between the p-n-p and n-p-n types of junction transistors. In both types, a base electrode is connected to the center region. An emitter electrode, including an arrowhead, is connected to the lower region. The emitter arrowhead points into the lower p region of the p-n-p transistors and away from the lower n region of the n-p-n transistors. A collector electrode is connected to the upper region of all the transistors in the drawing.

Fig. 1 shows a transistor amplifier with four transistors connected in cascade. A first transistor 10 has regions of p, n, and p material designated 11, 12 and 13, respectively. A source 14 of signal current *i* is connected over lead 15 to ground and over lead 16 to a base electrode 17 which is in low resistance contact with region 12. Emitter electrode 18 is connected to the positive terminal of a battery 19, the negative terminal of the battery being connected to ground. A by-pass capacitor 20 is connected in parallel with battery 19. The collector electrode 21, in contact with the region 11, is connected over lead 22 to the base electrode 23 of a n-p-n transistor 25. The emitter electrode 26 of transistor 25 is connected to the negative terminal of a battery 27, the positive terminal of the battery being connected to ground. A by-pass capacitor 28 is connected in parallel with the battery 27. The collector electrode 29 is connected over lead 33 to the base electrode 34 of a p-n-p junction transistor 35. The emitter electrode 36 of transistor 35 is connected over lead 37 to the positive terminal of battery 19. The collector electrode 38 is connected over lead 43 to base electrode 44 of an n-p-n transistor 45. The emitter electrode 46 of transistor 45 is connected over lead 47 to the negative terminal of battery 27. The collector electrode 48 is connected over a lead 49 to one terminal of a load impedance 50. The other terminal 53 of the load impedance is connected over leads 51 and 37 to the positive terminal of battery 19. According to an alternative construction, terminal 53 of load impedance 50 is connected through lead 54 to ground, which is equivalent to a connection to the positive terminal of battery 27. It will, of course, be understood that where a battery is referred to, any suitable source of unidirectional current may be employed.

It will be noted in Fig. 1 that transistor 10 is a p-n-p type, transistor 25 is an n-p-n type, transistor 35 is a p-n-p type and transistor 45 is an n-p-n type. The p-n-p transistors require a positive bias on the emitter electrode, and a negative bias on the collector electrode; and the directions of current flow (as distinguished from electron flow) in the electrodes are toward the body of the transistor in the emitter electrode (positive in direction) and out of the body of the transistor in the base and collector electrodes (negative direction). In the n-p-n transistors, the bias polarities and the directions of current flow in the electrodes are the opposite of those given above for the p-n-p transistors. The two types of junction transistors may be spoken of as opposite conductivity types or as possessing complementary symmetry. The cascade arrangement of transistors in Fig. 1 is such that the output of each transistor (except the last transistor 45) is connected to the input of a following transistor of opposite conductivity type. Stated another way, using the generic terminology, the output of an n-type transistor is connected to the input of a p-type transistor, and the output of a p-type transistor is connected to the input of an n-type transistor.

In Fig. 1, transistor 10 is biased by battery 19 for class A operation, that is, the transistor is biased in that both positive and negative swings of current from source 14 cause corresponding amplified swings of current in collector electrode 21. The current in collector 21 flows through lead 22, base electrode 23 of oppositely conductive transistor 25, the lower p-n region of transistor 25, and emitter electrode 26 to the negative terminal of battery 27.

The further amplified current in collector electrode 29 of transistor 25 flows from the positive terminal of battery 19, through lead 37, emitter electrode 36, the lower p-n region of transistor 35, base electrode 34 and lead 33 to collector electrode 29.

The still further amplified current in collector electrode 38 of transistor 35 flows through wire 43, base electrode 44 of transistor 45, the lower p-n region of transistor 45, emitter electrode 46 and lead 47 to the negative terminal of battery 27.

Finally, the four-times-amplified current in collector electrode 48 of transistor 45 flows from the positive terminal of battery 19, through leads 37 and 51, load impedance 50, and lead 49 to collector electrode 48. According to an alternative construction, the current may flow from the positive terminal of battery 27 through ground, lead 54, load impedance 50 and lead 49 to collector electrode 48.

From the foregoing it is seen that the collector current of each transistor (except the last transistor 45) flows in the proper direction to be applied directly to the base electrode of the following transistor of opposite conductivity type.

Since transistor 10 is biased for Class A operation by battery 19 and since the four transistors are directly connected together, the direct current bias on transistor 10, as well as the signal current *i*, is amplified in the succeeding transistors 25, 35 and 45. The bias on the last transistor 45 from a source 19 or 27 must be large enough to accommodate the portion of the current in collector electrode 48 which is due to amplification of the bias on first transistor 10, and also the portion of the current in collector electrode 48 which is due to amplification of the input signal *i*. If the design is such that a larger bias is required on transistor 45 than can be had by a connection from point 53 through dotted lead 54 and ground to the positive terminal of battery 27, point 53 may instead be connected, as shown in the drawing, over leads 51 and 37 to the positive terminal of battery 19.

It should be noted that in the amplifier of Fig. 1, the output of each transistor is directly connected to the input of the next following transistor over a path devoid of concentrated impedance. There is no coupling capacitor between transistors to interfere with the transfer of low frequency components of the signal. The amplifier thus amplifies the direct current component and low frequency components of the input signal *i* as well as the higher frequency components of the input signal.

An amplifier as shown in Fig. 1 was constructed using the following circuit elements:

| | |
|---|---|
| Transistors 10 and 35 | RCA type 2N34 |
| Transistors 25 and 45 | RCA type 2N35 |
| Batteries 19 and 27 | 6-volt dry batteries |
| Load impedance 50 ohms | 1000 |

A few microamperes of alternating current input signal *i* were amplified to 30–40 milliamperes through load 50.

Fig. 2 shows a transistor amplifier with two transistors connected in cascade in a circuit designed to provide class B operation. One signal input terminal 59 is connected to ground. The other signal input terminal 60 is connected to a base electrode 61 of an n-p-n junction transistor 62. An emitter electrode 63 is connected directly to ground and a base resistor 64 is connected from base electrode 61 to ground. A collector electrode 65 is connected over lead 70 to the base electrode 71 of a p-n-p junction transistor 72. Emitter electrode 73 of transistor 72 is connected to the positive terminal of a battery 74; the negative terminal of battery 74 is connected to ground. The collector electrode 75 is connected through a load resistor 76 to the negative terminal of a battery 77; the positive terminal of battery 77 is connected to ground. Collector electrode 75 is also connected to an output terminal 80; the other output terminal 81 is connected to ground.

The circuit of Fig. 2 shows an amplifier using two transistors of opposite conductivity types connected in cascade. Since there is no bias battery in circuit between the base electrode 61 of transistor 62 and emitter electrode 63, the transistor operates as a class B amplifier, i.e., there is practically no base current or amplified collector current in the absence of a positive signal at input terminal 60. Therefore, the circuit is especially useful as a pulse amplifier and it may be used as a horizontal pulse amplifier in a television receiver.

When a positive pulse is applied from terminal 60 to base electrode 61, an amplified current pulse flows from the positive terminal of battery 74, through emitter electrode 73, the lower p-n region of transistor 72, the base electrode 71 and lead 70 to the collector electrode 65 of transistor 62. This amplified current pulse causes a further amplified current pulse to flow from collector electrode 75 of transistor 72 through load resistor 76 to the negative terminal of battery 77. This further amplified current pulse in going through load resistor 76 causes a voltage pulse thereacross and the voltage wave at output terminals 80, 81 is a wave having a base line equal to the potential of battery 77 and having pulses superimposed on the line due to the current pulses through resistor 76. The direct-current component may be removed by passing the amplified signal from terminal 80 through a coupling capacitor (not shown) to a utilization device (not shown).

An amplifier as shown in Fig. 2 was constructed with the following circuit elements:

| | |
|---|---|
| Transistor 62 | RCA type 2N35 |
| Transistor 72 | RCA type 2N34 |
| Batteries 74 and 77 | 22½ volts |
| Input resistor 64 ohms | 1000 |
| Load resistor 76 do | 1000 |

A 6-volt pulse wave having a frequency of 15,750 cycles per second applied to input terminals 59, 60 resulted in an output pulse at output terminals 80, 81 of 40 volts.

Fig. 3 shows a pair of oppositely conductive transistors 90 and 95 (like those of Fig. 2) connected in class B push-pull with another pair of oppositely conductive transistors 105 and 110. The two pairs 90, 95 and 105, 110 are also oppositely conductive with relation to each other in that the first transistor 90 of one pair is an n-p-n junction transistor and the first transistor 105 of the other pair is a p-n-p junction transistor. My copending application Serial No. 319,401, filed November 7, 1952, and assigned to the assignee of this application, shows and claims a push-pull arrangement of oppositely conductive transistors providing parallel signal paths. In the present application, each of the parallel paths further includes oppositely conductive transistors connected in cascade.

An input signal applied to input terminals 85, 86 appears across resistor 87 and is applied over lead 88 to base electrode 89 of an n-p-n junction transistor 90. Emitter electrode 91 is connected to ground. Collector electrode 92 is connected over lead 93 to base electrode 94 of an oppositely conductive p-n-p junction transistor 95. An emitter electrode 96 is connected to the positive terminal of a battery 97: the negative terminal of battery 97 is grounded. A collector electrode 98 is connected over lead 99 to one side of an output impedance 100 which may, for example, be the voice coil of a loudspeaker. The portion of the circuit of Fig. 3 involving transistors 90 and 95 which has thus far been described is essentially the same as the circuit of Fig. 2.

The input signal impressed across resistor 87 is also applied over wire 103 to a base electrode 104 of a p-n-p junction transistor 105. It will be noted that the transistors 105 and 90 which are receptive to the input signal are of oppositely conductive types. An emitter electrode 106 of transistor 105 is connected to ground. A collector electrode 107 of transistor 105 is connected over lead 108 to the base electrode 109 of an oppositely conductive n-p-n transistor 110. An emitter electrode 111 is connected to the negative terminal of a battery 112; the positive terminal of battery 112 is connected to ground. A collector electrode 113 is connected over lead 114 to the common output impedance 100.

Transistors 90 and 95 are oppositely conductive transistors connected in cascade as a class B amplifier 83. Transistors 105 and 110 are also oppositely conductive transistors connected in cascade as a class B amplifier 84. The two cascade amplifiers differ in that the first transistor 90 of amplifier 83 and the first transistor 105 of amplifier 84 are of opposite conductivity types. This permits the two cascade amplifiers to be connected in push-pull with a common input impedance 87 and a common output impedance 100. In the operation of the circuit of Fig. 3, positive portions of a signal applied from input terminal 85 to base electrode 104 of transistor 105 are not amplified in transistors 105 and 110 because the polarity of the signal is such as to reduce the current in the base electrode 104 of p-n-p transistor 105, and in the absence of bias current in base electrode 104 the current is already practically zero. On the other hand, positive portions of a signal applied from input terminal 85 to base electrode 89 of transistor 90 are amplified in transistors 90 and 95 because the polarity of the signal is such as to increase the current in the base electrode 89 of n-p-n transistor 90. The positive portions of an input signal are thus amplified in transistors 90 and 95, after the manner described in connection with Fig. 2. The positive portions of an input signal result in amplified currents flowing through lead 99 into output impedance 100.

Negative portions of an input signal applied through input terminal 85 to base electrode 89 of n-p-n transistor 90 are of the wrong polarity to be amplified in transistors 90 and 95. However, the negative portions of the signal applied to base electrode 104 of p-n-p transistor 105 are the right polarity to be amplified in transistors 105 and 110 and cause an amplified current to flow from output impedance 100 through lead 114 to collector electrode 113. Cascade amplifier 83 thus amplifies the positive portions of an input signal and cascade amplifier 84 amplifies negative portions of the signal. In the absence of input signal, and with ideal transistors in the circuit, there is no current in the output impedance 100. This mode of operation is known in the art as class B push-pull. It will be understood that the transistors in Fig. 3 may, if desired, be biased to provide class A or class AB operation by the introduction of appropriate batteries between emitter electrode 91 and ground and between emitter electrode 106 and ground.

An amplifier as shown in Fig. 3 was constructed using the following circuit elements:

| | | |
|---|---|---|
| Transistors **90** and **110** | | RCA type 2N35 |
| Transistors **95** and **105** | | RCA type 2N34 |
| Batteries **97** and **112** | volts | 7½ |
| Input resistor **87** | ohms | 10,000 |
| Output impedance **100** | ohms | 16 |

A 1.6 milliwatt audio signal applied to input terminals 85, 86 resulted in 0.5 watt audio signal in loud speaker voice coil 100.

Fig. 4 shows two oppositely conductive transistors connected in cascade in an amplifier circuit including feedback means to compensate for the effect of leakage currents between the base and collector electrodes over the surface of the semi-conductive material. Input terminals 116 and 117 are connected across an input resistor 118, one end of which is grounded. Terminal 116 is connected to base electrode 119 of p-n-p junction transistor 120. An emitter electrode 121 is connected to the positive terminal of a battery 122; the negative terminal of battery 122 is connected to ground. A collector electrode 123 is connected over lead 124 to the base electrode 125 of an oppositely conductive n-p-n transistor 126. An emitter electrode 127 is connected through an emitter resistor 128 to the negative terminal of a battery 129; the positive terminal of battery 129 is connected to ground. A collector electrode 130 is connected through lead 131 and output impedance 132 to ground. Collector electrode 123, in addition to being connected over lead 124 to base electrode 125, is also connected through feed-back resistor 133 to the negative terminal of battery 129. A by-pass capacitor 134 may be connected across emitter resistor 128.

It will be noted that in the circuit of Fig. 4 there are two paths for the amplified current in collector electrode 123. One path is through base electrode 125, the p-n region of transistor 126, emitter electrode 127, and emitter resistor 128 to the negative terminal of battery 129. The other path is through feed-back resistor 133 to the negative terminal of battery 129. The value of feed-back resistor 133 is such that most of the amplified signal current from collector electrode 123 flows through the path including transistor 126, and little current flows through feed-back resistor 133 to reduce the gain of the amplifier.

In the present state of the art of manufacturing junction transistors, a large percentage of the transistors permit a surface leakage current to flow between the base and collector electrodes. Transistors presently manufactured vary as to the amount of leakage current which can flow. In the circuit of Fig. 4, different transistors can be plugged in, and the circuit will provide compensation for the leakage current in proportion to the amount of the leakage current peculiar to the particular transistor.

The operation of the feed-back circuit of Fig. 4 will now be described. Battery 129 maintains collector electrode 130 positive relative to emitter electrode 127 and base electrode 125. When a surface leakage current flows from collector electrode 130 to base electrode 125, the latter is made more positive, relative to emitter electrode 127, than it otherwise would be. This results in an increased current flowing from base electrode 125 through the lower p-n region of transistor 126, emitter electrode 127 and emitter resistor 128 to the negative terminal of battery 129. This current in flowing through emitter resistor 128, develops a potential negative with respect to emitter electrode 127 which is applied through feed-back resistor 133 to the base electrode 125. Stated another way, the current flowing through emitter resistor 128 causes a voltage drop thereacross which makes the emitter electrode 127 more positive with respect to ground than it was. The potential of base electrode 125 with respect to ground remains substantially the same since it is connected to ground through feedback resistor 133 and battery 129. Therefore, the potential on the emitter electrode 127 is made more positive relative to the base electrode 125, which is the same as saying that the potential on the base electrode 125 is made more negative relative to the emitter electrode 127. The negative potential applied to base electrode 125 neutralizes the major part of the positive potential imparted to base electrode 125 by the surface leakage current from collector electrode 130. It will be understood that the feed-back scheme to neutralize the effect of surface leakage current may be employed on the succeeding stages of a transistor amplifier including more than the two transistors shown in Fig. 4.

A by-pass capacitor 134 may be employed to improve the high-frequency response of the amplifier by providing a path around emitter resistor 128 having a low impedance to high-frequency components of the signal.

A transistor amplifier as shown in Fig. 4 was constructed using the following circuit elements:

| | | |
|---|---|---|
| Transistor **120** | | RCA type 2N34 |
| Transistor **126** | | RCA type 2N35 |
| Batteries **122** and **129** | volts | 22½ |
| Input resistor **118** | ohms | 10,000 |
| Output resistor **132** | do | 1,000 |
| Feed-back resistor **133** | do | 5,000 |
| Emitter resistor **128** | do | 1,000 |
| Capacitor **134** | microfarads | 0.5 |

An audio input signal of from 2 to 3 volts applied to input terminals 116, 117 resulted in an audio output signal across output resistor 132 of about 40 volts.

Fig. 5 shows two oppositely conductive transistors connected in cascade in an amplifier circuit including means to improve the high frequency response of the amplifier. Input terminals 136 and 137, respectively, are connected to base electrode 138 of a p-n-p junction transistor 140, and to ground. An input resistor 139 is connected between base electrode 138 and ground. Emitter electrode 141 is connected to the positive terminal of a battery 142; the negative terminal of battery 142 is connected to ground. Collector electrode 143 is connected over lead 144 to the base electrode 145 of an oppositely conductive n-p-n junction transistor 150, and also through a feed-back resistor 146 and a feed-back inductor 147 to the negative terminal of a battery 148. Emitter electrode 151 of transistor 150 is connected through an emitter resistor 152 to the negative terminal of battery 148. A by-pass capacitor 154 is connected across emitter resistor 152. The collector electrode 155 is connected through lead 156 and output impedance 160 to ground.

Fig. 5 is like Fig. 4, inter alia, in that the feed-back circuit compensates for surface leakage current between collector electrode 155 and base electrode 145. In Fig. 5, the resistance of resistor 146 and inductor 147 in series serves the same function as the resistance of resistor 133 in Fig. 4. Emitter resistor 152 in Fig. 5 serves the same purpose as resistor 128 in Fig. 4. In addition, the reactive impedance of inductor 147 serves to improve the high-frequency response of the amplifier of Fig. 5. Inductor 147 is in one of the parallel paths available to signal current from collector electrode 143 and it presents a higher impedance to high-frequency components of the signal than to low-frequency components. Therefore, the major portion of the high-frequency current flows into base electrode 145 and little is lost in the parallel path including resistor 146 and inductor 147. As a result, the high-frequency response of the amplifier is improved.

An amplifier as shown in Fig. 5 was constructed utilizing the following circuit elements:

| | | |
|---|---|---|
| Transistor 143 | RCA type | 2N34 |
| Transistor 150 | RCA type | 2N35 |
| Battery 142 | volts | 1½ |
| Battery 148 | do | 3 |
| Input resistor 139 | ohms | 10,000 |
| Output resistor 160 | do | 6,800 |
| Resistor 146 | do | 100 |
| Resistor 152 | do | 1,000 |
| Capacitor 154 | microfarads | 0.5 |
| Inductor 147 | microhenries | 0.14 |

The gain of the amplifier at a signal frequency of one megacycle with inductor 147 in the circuit improved by a factor of about 20 compared with the gain without inductor 147 in the circuit.

While Fig. 1 shows four transistors alternately of one and the other conductivity type connected in cascade, and Figs. 2 through 5 show two oppositely conductive transistors in cascade, it will be understood that any reasonable number of transistors can be connected in cascade. The number of transistors may be even or odd.

It is apparent that by utilizing the complementary symmetry of n-type and p-type transistors, signal translating circuits can be constructed which effectively handle the direct-current component and the alternating current components of an input signal. The circuits are very simple and require a minimum number of circuit elements.

The present invention teaches one how to utilize with advantage semi-conductor transistor devices of opposite conductivity types in cascade or tandem. Although the transistor circuits have been illustrated and described as base-input, grounded-emitter circuits, there are some applications in which it may be desirable to employ emitter-input, grounded-base circuits.

What is claimed is:

1. A cascade connected signal amplifier circuit comprising, in combination, a first individual transistor of one conductivity type having a base, an emitter, and a collector electrode, input circuit means connected to apply an input signal to said base electrode, a second individual transistor of an opposite conductivity type having a base, an emitter, and a collector electrode, means providing a direct-current supply source having a pair of terminals, direct-current conductive means connecting the emitter electrode of said first transistor with one of said terminals, direct-current conductive means connecting the emitter electrode of said second transistor with the other of said terminals, said supply source being poled in said circuit to forward bias said emitter electrodes with respect to the respective base electrodes, means directly connecting the collector electrode of said first transistor with the base electrode of said second transistor and providing a direct current conductive connection therebetween, and output circuit means connected for deriving an output signal representative of an amplified version of said input signal from between the collector and emitter electrodes of said second transistor.

2. A cascade connected signal amplifier circuit comprising, in combination, a first individual junction transistor of one conductivity type having a base, an emitter, and a collector electrode, input circuit means connected to apply an input signal to said base electrode, a second individual junction transistor of an opposite conductivity type having a base, an emitter, and a collector electrode, means providing a direct-current supply source having a pair of terminals, direct-current conductive means connecting the emitter electrode of said first transistor with one of said terminals, direct-current conductive means connecting the emitter electrode of said second transistor with the other of said terminals, said supply source being poled in said circuit to forward bias said emitter electrodes with respect to the respective base electrodes, means directly connecting the collector electrode of said first transistor with the base electrode of said second transistor and providing a direct-current conductive connection therebetween, direct-current conductive impedance means connected from the junction of said first collector electrode and said second base electrode to the other terminal of said source, and output circuit means connected for depriving an output signal representative of an amplified version of said input signal from between the collector and emitter electrodes of said second transistor.

3. A signal amplifier circuit comprising, in combination, an output stage including a first individual transistor of one conductivity type having a base, an emitter and a collector electrode, a second individual transistor of an opposite conductivity type having a base, an emitter and a collector electrode, and output circuit means connected with the collector electrode of said first and second transistors for deriving a push-pull output signal therefrom; a driver stage including a third individual transistor of said opposite conductivity type having a base, an emitter and a collector electrode, a fourth individual transistor of said one conductivity type having a base, an emitter and a collector electrode, and input signal means connected for simultaneously applying an input signal to the base electrodes of said third and fourth transistors; means providing a direct-current supply source having a pair of terminals of opposite polarity; direct-current conductive means connecting the emitter electrode of said first transistor with one of said terminals; direct-current conductive means connecting the emitter electrode of said second transistor with the other of terminals; direct-current conductive means connecting the emitter electrodes of said third and fourth transistors with an intermediate point of said supply source; said supply source being poled in said circuit to forward bias said emitter electrodes with respect to the respective base electrodes; means directly connecting the collector electrode of said third transistor with the base electrode of said first transistor and providing a direct current conductive connection therebetween; and means directly connecting the collector electrode of said fourth transistor with the base electrode of said second transistor and providing a direct current conductive connection therebetween.

4. In combination, two junction transistors each having an emitter electrode, a base electrode, and a collector electrode; each electrode of the first transistor being composed of a semi-conductive material having opposite polarity carriers from the corresponding electrode of the second transistor; means for impressing a signal on the base electrode of the first transistor; means for biasing said base electrode in the forward direction; means directly connecting the collector electrode of said first transistor to the base electrode of the second transistor; a source of potential, means connecting one terminal of said source of potential to the emitter electrode of the first transistor, means connecting the other terminal of said source potential to the emitter electrode of the second transistor so that said source of potential provides both reverse bias for the collector electrode of the first transistor relative to the emitter electrode thereof and forward bias for the base electrode of the second transistor relative to the emitter electrode thereof; and means directly connecting the collector electrode of the second transistor to a load.

5. In a device for amplifying signals, a first semiconductor amplifier of the junction type including at least an emitter, a base, and a collector, means for applying a signal to be amplified between said base and said emitter, means for biasing said base in the forward direction with respect to said emitter to cause charge carriers to be injected into said transistor, means for biasing said collector in the reverse direction so that said charge carriers flowing from said emitter pass through a high impedance barrier thereby amplifying said signal, a second semi-conductor amplifier of the junction type including at least emitter, base, and collector electrodes, said electrodes of said second semi-conductor amplifier being of opposite polarity from the corresponding electrode of said first semi-conductor amplifier, means directly connecting said collector of said first semi-conductor amplifier to said base of said second semi-conductor amplifier, said base of said second semi-conductor amplifier being biased in the forward direction relative to said emitter of said second semi-conductor amplifier by said collector biasing means of said first semi-conductor amplifier, means for biasing said collector of said second semi-conductor amplifier in the reverse direction so that carriers leaving the emitter are collected through a high impedance barrier thereby amplifying the signal impressed on the base of the second semi-conductor amplifier, a load resistor, and means for directly connecting the output of the said second semi-conductor amplifier to said load resistor.

6. A cascade connected signal amplifier circuit comprising, in combination, a first individual transistor of one conductivity type having a base, an emitter, and a collector electrode, input circuit means connected to apply an input signal to said base electrode, a second individual transistor of an opposite conductivity type having a base, an emitter, and a collector electrode, at least the first one of said transistors being a junction transistor, means providing a direct-current supply source having a pair of terminals, direct-current conductive means connecting the emitter electrode of said first transistor with one of said terminals, direct-current conductive means connecting one of said emitter and base electrodes of said second transistor with the other of said terminals, means directly connecting the collector electrode of said first transistor with the other one of said emitter and base electrodes of the second transistor and providing a direct-current conductive signal connection therebetween, means connected to apply to said last-named direct-current conductive connection a bias voltage derived from said direct-current supply source, said supply source being poled in said circuit to forward bias said emitter electrodes with respect to the respective base electrodes, and output circuit means connected for deriving an output signal representative of an amplified version of said input signal from between the collector and said one of the emitter and base electrodes of said second transistor.

References Cited in the file of this patent

UNITED STATES PATENTS

| | | |
|---|---|---|
| 2,517,960 | Barney et al. | Aug. 8, 1950 |
| 2,533,001 | Eberhard | Dec. 5, 1950 |
| 2,541,322 | Barney | Feb. 13, 1951 |
| 2,647,958 | Barney | Aug. 4, 1953 |
| 2,660,624 | Bergson | Nov. 24, 1953 |
| 2,666,817 | Raisbeck et al. | Jan. 19, 1954 |
| 2,666,818 | Shockley | Jan. 19, 1954 |
| 2,666,819 | Raisbeck | Jan. 19, 1954 |

FOREIGN PATENTS

| | | |
|---|---|---|
| 665,867 | Great Britain | Jan. 30, 1952 |
| 673,604 | Great Britain | June 11, 1952 |

OTHER REFERENCES

Text, "The Transistor," pages 183–188, published December 1951, by Bell Telephone Labs. Inc.